United States Patent
Fu et al.

(10) Patent No.: US 7,028,755 B2
(45) Date of Patent: Apr. 18, 2006

(54) HEAT DISSIPATION DEVICE WITH INTERLOCKING FIN PLATES

(75) Inventors: Xue Ding Fu, Shenzhen (CN); Yong Zhi Tang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/842,765

(22) Filed: May 10, 2004

(65) Prior Publication Data

US 2004/0231827 A1    Nov. 25, 2004

(30) Foreign Application Priority Data

May 9, 2003    (TW) ............................... 92208543 U

(51) Int. Cl.
*F28F 7/00*    (2006.01)
(52) U.S. Cl. .................... 165/80.3; 165/185; 361/697
(58) Field of Classification Search ............... 165/80.3, 165/76, 78, 185; 361/697
See application file for complete search history.

(56) References Cited

U.S. PATENT DOCUMENTS

| | | | | |
|---|---|---|---|---|
| 5,558,155 | A * | 9/1996 | Ito .............................. | 165/80.3 |
| 6,340,056 | B1 * | 1/2002 | Huang et al. ............... | 165/185 |
| 6,644,397 | B1 * | 11/2003 | Shen .......................... | 165/185 |
| 6,651,733 | B1 * | 11/2003 | Horng et al. ............... | 165/80.3 |
| 6,729,384 | B1 * | 5/2004 | Lo .............................. | 165/80.3 |
| 6,754,079 | B1 * | 6/2004 | Chang ......................... | 165/185 |
| 6,772,828 | B1 * | 8/2004 | Chen ........................... | 165/78 |
| 6,880,621 | B1 * | 4/2005 | Wang .......................... | 165/80.3 |
| 2003/0116304 | A1 * | 6/2003 | Ho et al. .................... | 165/80.3 |

FOREIGN PATENT DOCUMENTS

| | | |
|---|---|---|
| CN | 2386482 Y | 7/2000 |
| CN | 2415390 Y | 1/2001 |
| CN | 2487019 Y | 4/2002 |
| JP | 3094553 | 6/2003 |
| TW | 460110 | 10/2001 |
| TW | 526949 | 4/2003 |

* cited by examiner

*Primary Examiner*—Teresa J. Walberg
(74) *Attorney, Agent, or Firm*—Wei Te Chung

(57) ABSTRACT

A heat dissipation device (20) includes a plurality of individual fin plates (40) arranged side by side. Each fin plate includes a main body (42). First and second flanges (44, 46) extend perpendicularly from opposite edges of the main body of each fin plate. A pair of tongues (48) is stamped perpendicularly from the main body and is opposite to the first flange. A pair of projections (49) is stamped from the main body adjacent and opposite to the second flange. Protrusions (442) are formed at the first flange and holes (482) are defined in the tongues respectively. The tabs of a first fin plate are interlocked with the projections of an adjacent second fin plate. The protrusions of the first fin plate are received in the holes of the second fin plate. In similar fashion, all the fin plates are assembled together. The heat dissipation device is thus formed.

14 Claims, 7 Drawing Sheets

HEAT DISSIPATION DEVICE WITH INTERLOCKING FIN PLATES

BACKGROUND OF THE INVENTION

1. Field of the Invention

The present invention relates to heat dissipation devices for removing heat from electronic devices, and more particularly to a heat dissipation device including a plurality of individual fin plates that are interlocked together.

2. Description of Prior Art

Conventional heat dissipation devices used for removing heat from electronic devices are mostly formed by extrusion of metallic material. FIG. 6 shows an example of this kind of heat dissipation device. The heat dissipation device 10 comprises abase, and a plurality of pins integrally extending from the base. The pins are relatively thick in comparison with distances defined between each two adjacent pins, due to inherent limitations in extrusion technology. This restricts the number of the pins that can be formed, and a total heat dissipation area that can be provided by the pins. Furthermore, a height "h" of the pins is limited to about 13 times a distance "d" between each two adjacent pins, also due to inherent limitations in extrusion technology.

With the continuing boom in electronics technology, numerous modern electronic devices such as central processing units (CPUs) of computers can operate at very high speeds and thus generate large amounts of heat. The heat must be efficiently removed from the CPU; otherwise, abnormal operation or damage may result. Conventional extruded heat dissipation devices are increasingly no longer able to adequately remove heat from these contemporary electronic devices.

In order to keep pace with these developments in electronics technology, assembled heat dissipation devices have been gaining in popularity. FIG. 7 shows an assembled heat dissipation device 30 having a plurality of uniformly dimensioned individual plate fins 32 evenly stacked together. Each fin 32 forms top and bottom flanges 34. Each flange 34 defines a pair of slots 36 at a junction with a main body of the fin 32. Each flange 34 forms a pair of tabs 38 extending from an outer edge thereof at the slots 36 respectively. The tabs 38 of each fin 32 engage in the slots 36 of an adjacent fin 32. Protrusions 39 formed on the tabs 38 of each fin 32 are blocked by the main body of the adjacent fin 32 such that said tabs 38 are retained in the slots 36 of the adjacent fin 32. Thus, all the fins 32 are connected together to form the heat dissipation device 30. However, the fins 32 are held together only by reason of the blocking of the protrusions 39 by the main bodies of the fins 32. The protrusions 39 are prone to be disengaged from the corresponding adjacent fins 32 when the heat dissipation device 30 is subjected to shock or vibration during transportation or in operation. Part of or even the entire stack of fins 32 may collapse.

SUMMARY OF THE INVENTION

Accordingly, an object of the present invention is to provide a heat dissipation device including a plurality of individual fin plates that yield a relatively large total heat dissipation area.

Another object of the present invention is to provide a heat dissipation device including a plurality of individual fin plates attached together so that the heat dissipation device is stable and sturdy.

In order to achieve the objects set out above, a heat dissipation device in accordance with a preferred embodiment of the present invention comprises a plurality of individual fin plates arranged side by side. Each fin plate includes a main body. First and second flanges extend perpendicularly from opposite edges of the main body of each fin plate. A pair of tongues is stamped perpendicularly from the main body and is opposite to the first flange. A pair of projections is stamped from the main body adjacent and opposite to the second flange. Protrusions are formed at the first flange and holes are defined in the tongues respectively. The tabs of a first fin plate are interlocked with the projections of an adjacent second fin plate. The protrusions of the first fin plate are engagingly received in the holes the tongues of the second fin plate. In similar fashion, all the fin plates are assembled together. The heat dissipation device is thus formed. In an alternative embodiment, the protrusions are formed on the tongues and the holes are defined in the first flange of each fin plate.

Other objects, advantages and novel features of the present invention will become more apparent from the following detailed description when taken in conjunction with the accompanying drawings, in which:

DETAILED DESCRIPTION OF THE INVENTION

Figure 1:
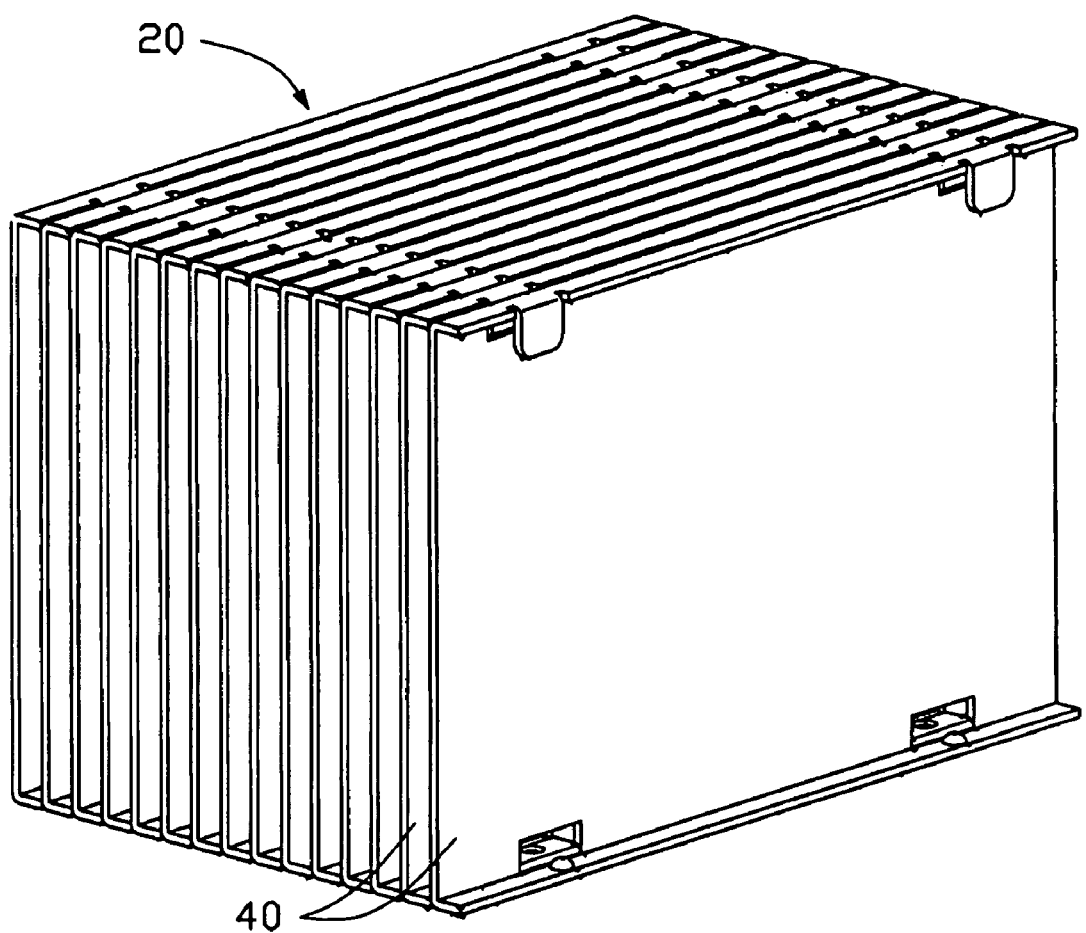
FIG. 1 is an isometric view of a heat dissipation device in accordance with the preferred embodiment of the present invention, the heat dissipation device comprising a plurality of fin plates.
Figure 2:
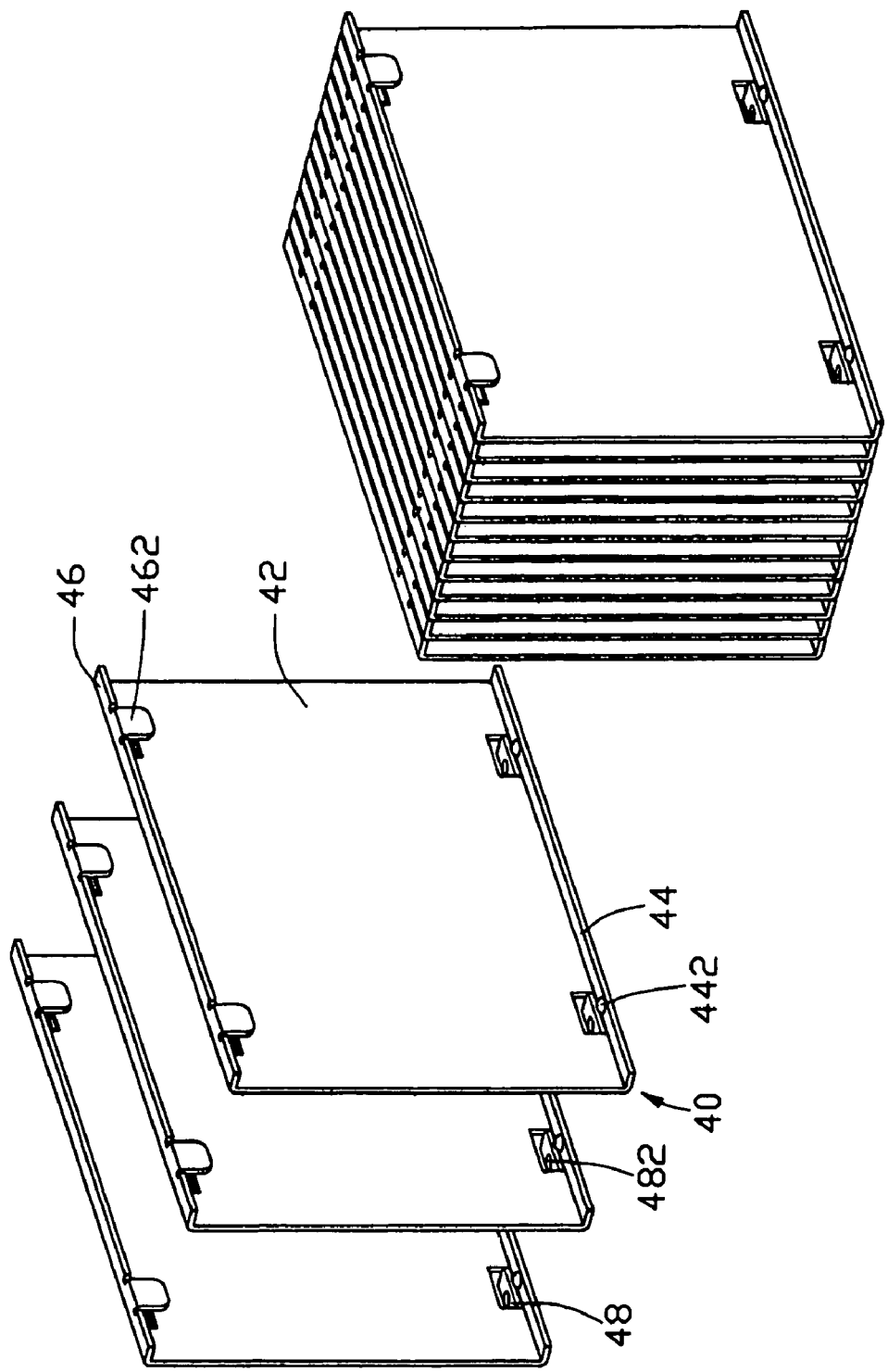
FIG. 2 is an exploded view of the heat dissipation device of FIG. 1.
Figure 3:
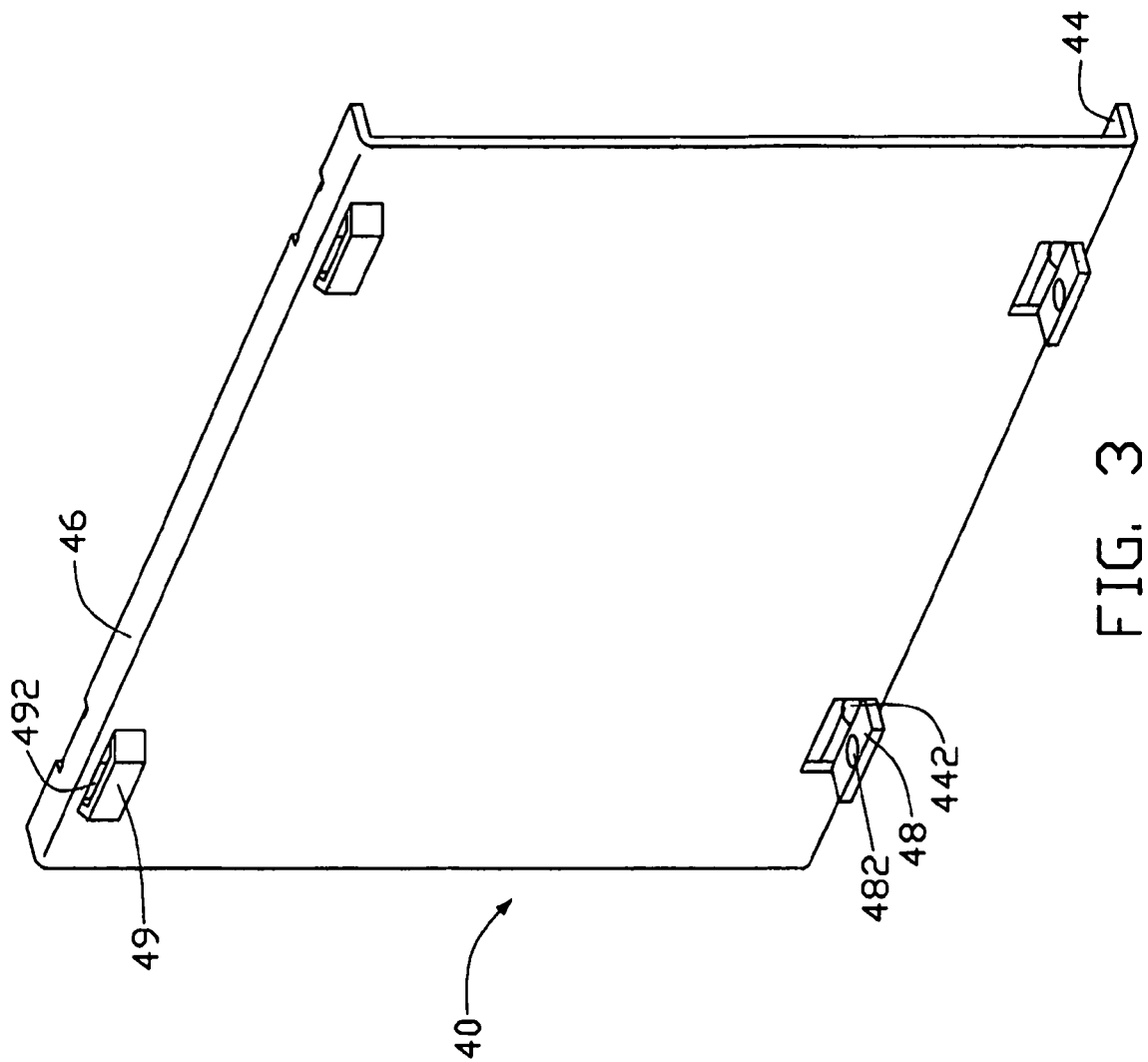
FIG. 3 is an isometric view of a fin plate of the heat dissipation device of FIG. 1, but viewed from another aspect.

Referring to FIGS. 1–3, a heat dissipation device 20 in accordance with the preferred embodiment of the present invention comprises a plurality of individual fin plates 40 arranged side by side.

Each fin plate 40 is metallic, and has a main body 42. First and second flanges 44, 46 extend perpendicularly in a first direction from opposite bottom and top edges of the main body 42 respectively. A pair of spaced tongues 48 is stamped perpendicularly from the main body 42 at the first flange 44, in a second direction that is opposite to the first direction. That is, the tongues 48 and the first flange 44 are located adjacent opposite main faces of the main body 42, with the tongues 48 being slightly above the first flange 44. Each tongue 48 defines a through hole 482 therein. A pair of spaced protrusions 442 is stamped upwardly from the first flange 44 of each fin plate 40, corresponding to the holes 482 of an adjacent fin plate 40. A pair of spaced bridge-shaped projections 49 is stamped from the main body 42 adjacent the second flange 46 in the second direction. The projections 49 thus define a pair of splits 492 therein. The splits 492 are slightly below the second flange 46. A pair of spaced tabs 462 extends perpendicularly from a distal edge of the second flange 46 toward the first flange 44, the tabs 462 being parallel to the main body 42.

In assembly of the fin plates 40 to form the hest dissipation device 20, the tabs 462 of a first fin plate 40 are engagingly received in the splits 492 of an adjacent second fin plate 40. The main body 42 of the first fin plate 40 is pressed toward the second fin plate 40, so that the protrusions 442 of the first flange 44 of the first fin plate 40 are engagingly received in the holes 482 of the tongues 48 of the second fin plate 40. Thus, the first fin plate 40 is attached to the second fin plate 40. In similar fashion, all the fin plates 40 are assembled together, and the heat dissipation device 20 is thus formed. The first flanges 44 are coplanar with each other, and the second flanges 46 are coplanar with each other. The heat dissipation device 20 can be mounted on a surface of a heat-generating device (not shown).

Figure 4:
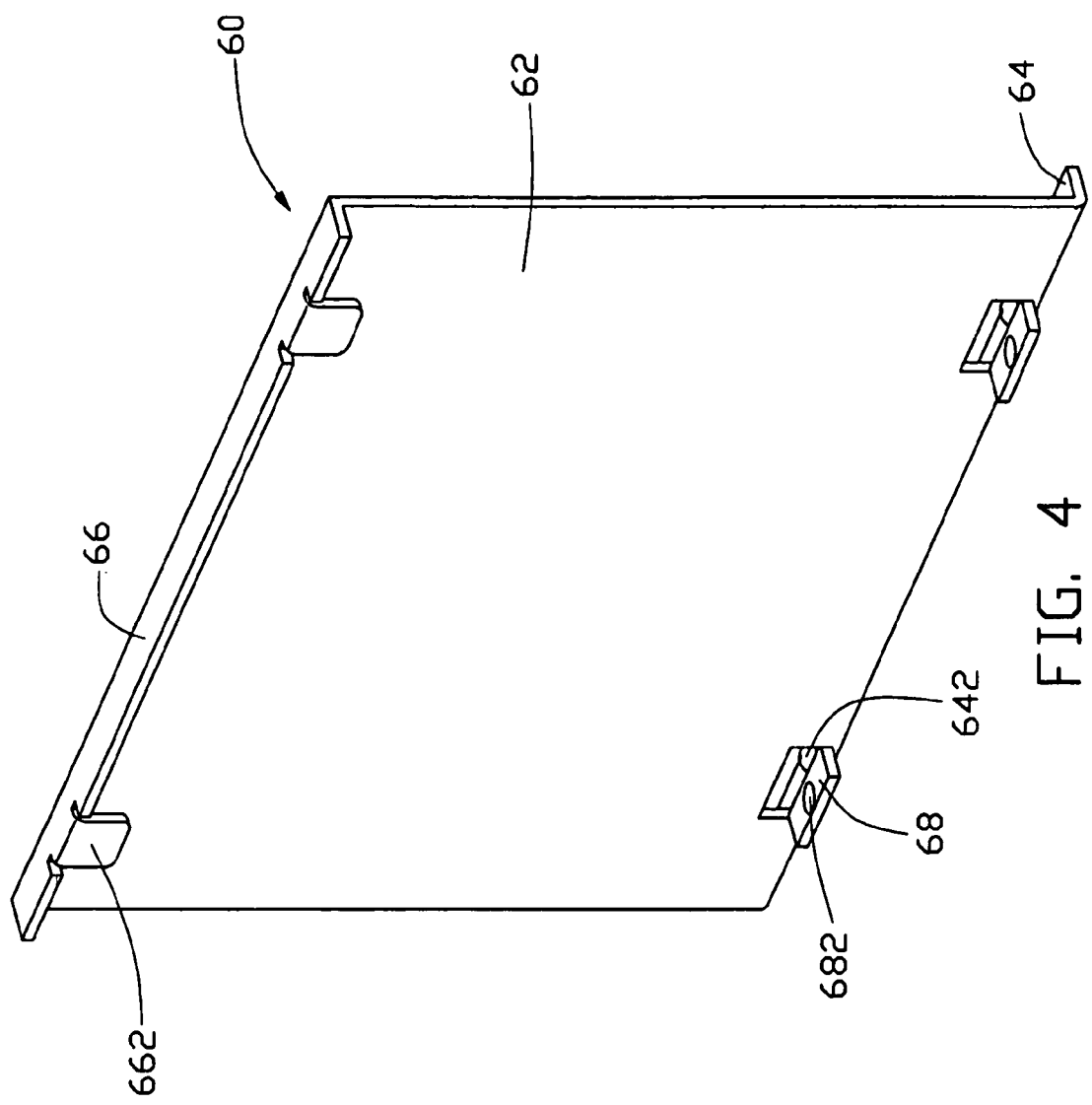
FIG. 4 is an isometric view of a fin plate of a heat dissipation device in accordance with the alternative embodiment of the present invention.
Figure 5:
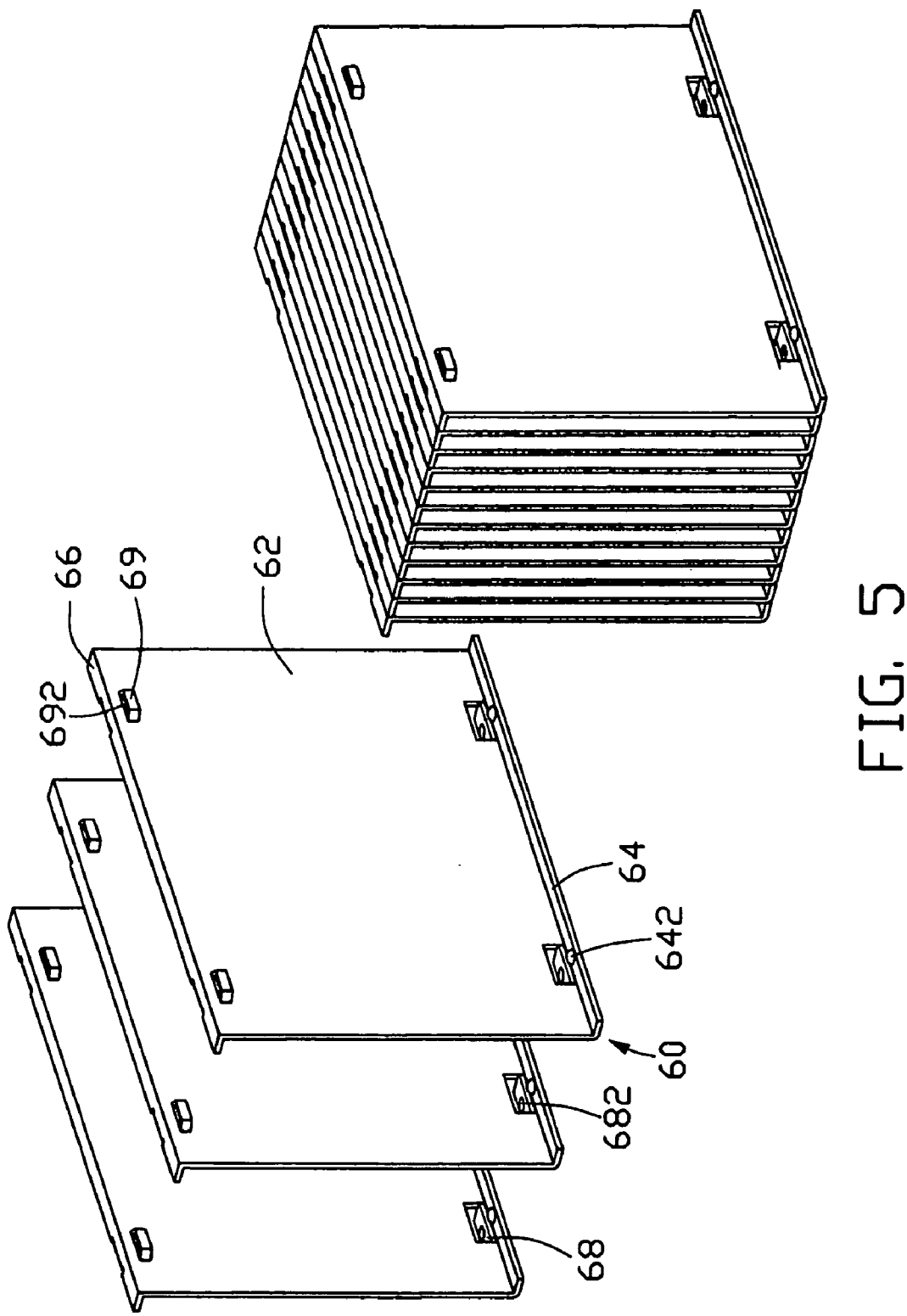
FIG. 5 is an exploded, isometric view of the heat dissipation device in accordance with the alternative embodiment of the present invention.
Figure 6:
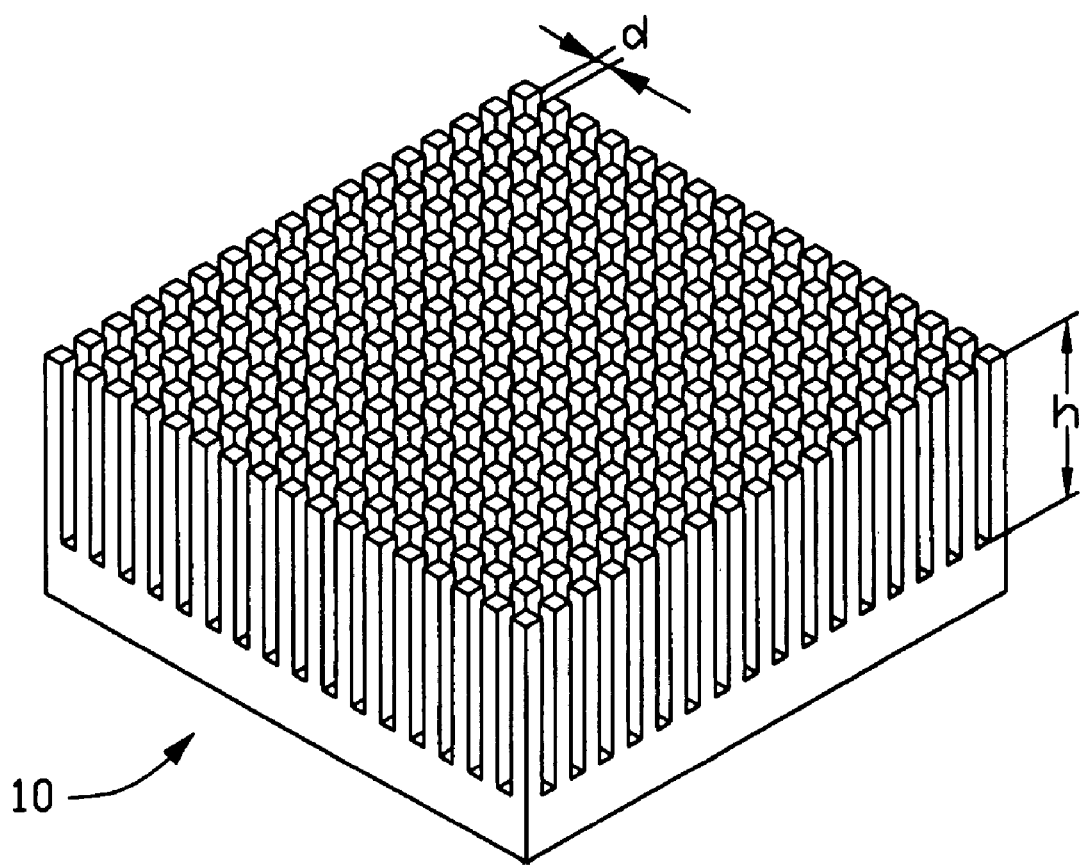
FIG. 6 is an isometric view of a conventional heat dissipation device.
Figure 7:
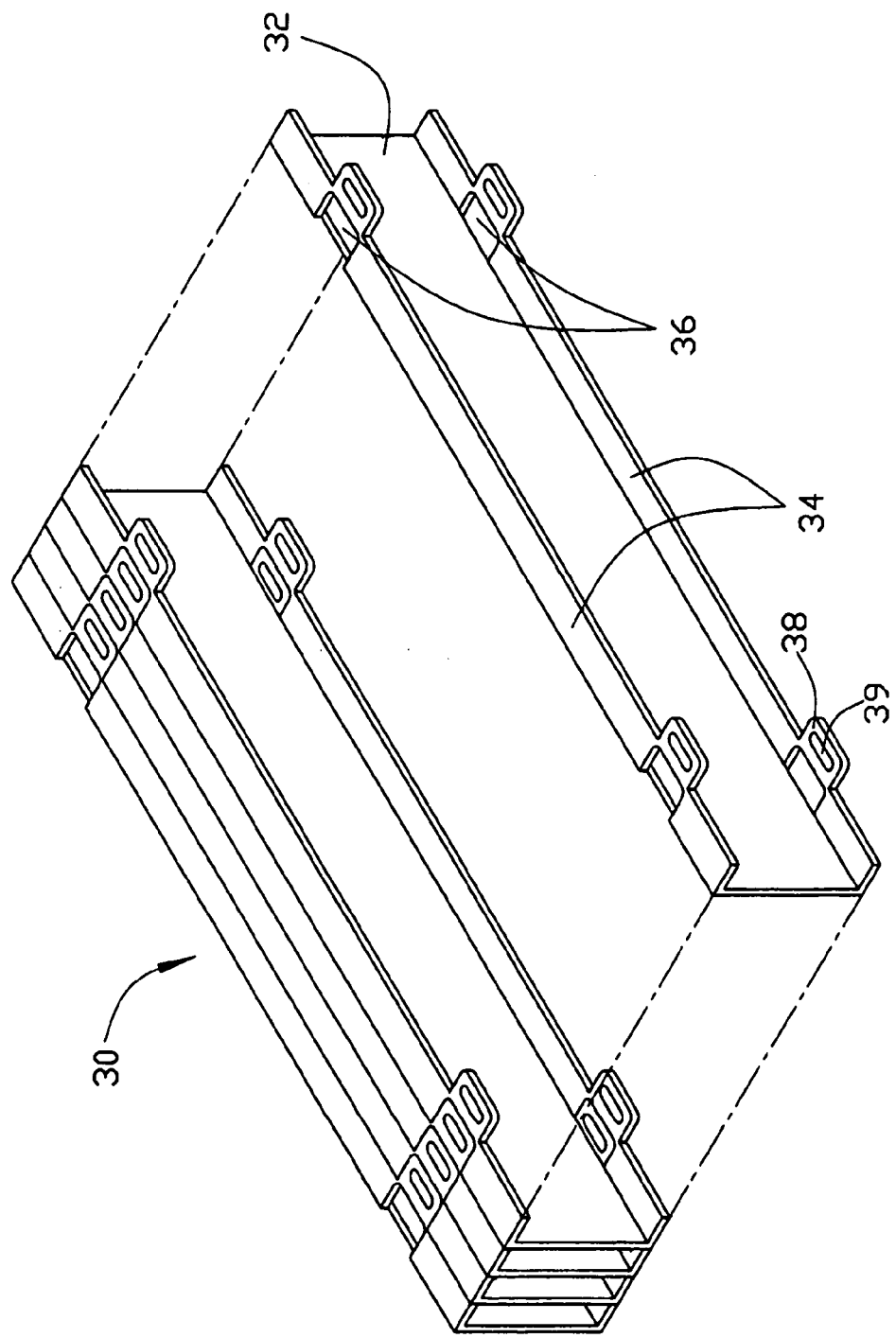
FIG. 7 is an isometric view of another conventional heat dissipation device formed from a plurality of individual fins.

FIG. 4 shows a fin plate 60 in accordance with the alternative embodiment of the present invention. The fin plate 60 is metallic, and comprises a main body 62. A first flange 64 and a second flange 66 extend perpendicularly in opposite first and second directions from opposite bottom and top edges of the main body 62 respectively. A pair of spaced tongues 68 is stamped perpendicularly from the main body 62 at the first flange 64 in the second direction. That is, the tongues 68 and the first flange 64 are located adjacent opposite main faces of the main body 62. Each tongue 68 defines a through hole 682 therein. A pair of spaced protrusions 642 is stamped upwardly from the first flange 64 of each fin plate 60, corresponding to the holes 682 of an adjacent fin plate 60. A pair of spaced bridge-shaped projections 69 is stamped from the main body 62 adjacent the second flange 66 in the first direction (shown in FIG. 5). The projections 69 thus define a pair of splits 692 therein. A pair of spaced tabs 662 extends perpendicularly from a distal edge of the second flange 66 toward the tongues 68, and the tabs 662 are parallel to the main body 62. In assembly of a plurality of the fin plates 60, the tabs 662 of a first fin plate 60 are engagingly received in the splits 692 of an adjacent second fin plate 60. The protrusions 642 of the second fin plate 60 are engagingly received in the holes 682 of the tongues 68 of the first fin plate 60. In similar fashion, all the fin plates 60 are assembled together.

In a further alternative embodiment of the present invention, the locations of the protrusions 442 and the holes 482 of each fin plate 40 are interchanged. In a still further alternative embodiment of the present invention, the locations of the protrusions 642 and the holes 682 of each fin plate 60 are interchanged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
a plurality of individual fin plates arranged side by side, each of the fin plates comprising:
a main body;
a first flange extending from the main body;
a second flange extending from the main body, the second flange being parallel to and spaced from the first flange, a tab extending from the second flange;
a tongue extending from the main body generally opposite to the first flange; and
a projection extending from the main body, the projection being generally opposite to the second flange;
wherein one of the tongue and the first flange defines a hole thereat, a protrusion is formed on the other of the tongue and the first flange, the protrusion of each fin plate is received in the hole of an adjacent fin plate, and the tab of each fin plate is interlocked with the projection of an adjacent fin plate.

2. The heat dissipation device of claim 1, wherein the first flange perpendicularly extends from an edge of the main body, the second flange perpendicular extends from an opposite edge of the main body, and the tab and the tongue are perpendicular to the second flange and the main body respectively.

3. The heat dissipation device of claim 1, wherein the tab is parallel to the main body.

4. The heat dissipation device of claim 1, wherein the projection defines a split.

5. The heat dissipation device of claim 4, wherein the split and the tongue are between the first and second flanges.

6. The heat dissipation device of claim 4, wherein the tab of each fin plate is engagingly received in the split of an adjacent fin plate.

7. The heat dissipation device of claim 1, wherein the first flanges of the fin plates are coplanar.

8. The heat dissipation device of claim 1, wherein the second flanges of the fin plates are coplanar.

9. The heat dissipation device of claim 1, wherein the projection is generally bridge-shaped.

10. A heat dissipation device comprising:
a plurality of individual fins arranged side by side with one another, each of said fins comprising:
a vertical planar main body extending in a longitudinal direction;
an upper flange extending horizontally on an upper edge of the main body away from the main body in a first lateral direction perpendicular to said longitudinal direction;
a lower flange extending horizontally on a lower edge of the main body away from the main body in said first lateral direction and aligned with the upper flange in a vertical direction perpendicular to both said longitudinal direction and said first lateral direction;
at least one upper projection extending from at or near the upper edge in a second lateral direction opposite to said first lateral direction, the upper projection having a bridge-shaped configuration and cooperating with the corresponding main body to define therebetween a slit;
at least one lower projection extending from at or near the lower edge in said second lateral direction;
upper engaging means formed on the upper flange of one fin locked to the upper projection of a neighboring fin located in said first lateral direction; and
lower engaging means formed on the lower flange of said one fin locked to the lower projection of said neighboring fin located in said first lateral direction; wherein
said one fin and said neighboring fin are spaced from each other in said first lateral direction via the upper flange and the lower flange, and said upper engaging means is essentially downwardly assembled to the slit of the corresponding upper projection in said vertical direction.

11. The heat dissipation device of claim 10, wherein by said upper engaging means and said lower engaging means, said one fin and said neighboring fin cannot be disengaged from each other in said first lateral direction.

12. The heat dissipation device of claim 10, wherein the upper flange and the lower flange of said one fin commonly sandwich the upper projection and the lower projection of said neighboring fin so as to prevent relative movement between said one fin and said neighboring fin in said vertical direction.

13. The heat dissipation device of claim 10, wherein the lower projection is a horizontal tab abutting against the lower flange of said neighboring fin located in the second lateral direction.

14. A heat dissipation device comprising:
   a plurality of individual fins arranged side by side with one another, each of said fins comprising:
   a vertical planar main body extending in a longitudinal direction;
   an upper flange extending horizontally on an upper edge of the main body away from the main body in a first lateral direction perpendicular to said longitudinal direction;
   a lower flange extending horizontally on a lower edge of the main body away from the main body in a second lateral direction opposite to said first lateral direction;
   at least one upper projection extending from at or near the upper edge in said second lateral direction opposite to said first lateral direction, the upper projection being lower than the upper flange in the vertical direction and defining a slit therein; and
   at least one lower projection extending from at or near the lower edge in said first lateral direction, the lower projection being higher than the lower flange and defining a hole or a protrusion thereat; wherein
   the upper projection of one fin confronts the corresponding upper flange of one neighboring fin located in the second lateral direction at the slit, and the lower projection of said fin confronts the corresponding lower flange of said one neighboring fin located in said first lateral direction at the hole.

* * * * *